United States Patent
Cook et al.

[11] Patent Number: 6,150,707
[45] Date of Patent: *Nov. 21, 2000

[54] METAL-TO-METAL CAPACITOR HAVING THIN INSULATOR

[75] Inventors: Robert K. Cook, Poughkeepsie; Craig R. Gruszecki, Hopewell Junction; Mark A. Passaro, Hopewell Junction; Frederick A. Scholl, Hopewell Junction, all of N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 09/226,243

[22] Filed: Jan. 7, 1999

[51] Int. Cl.[7] .................................................. H07L 29/41
[52] U.S. Cl. ................................... 257/535; 257/306
[58] Field of Search ................................ 257/306, 532, 257/535, 301

[56] References Cited

U.S. PATENT DOCUMENTS

| | | |
|---|---|---|
| 4,827,323 | 5/1989 | Tigelaar et al. . |
| 5,005,102 | 4/1991 | Larson . |
| 5,143,861 | 9/1992 | Turner . |
| 5,208,726 | 5/1993 | Apel . |
| 5,216,572 | 6/1993 | Larson et al. . |
| 5,281,837 | 1/1994 | Kohyama . |
| 5,335,138 | 8/1994 | Sandhu et al. . |
| 5,339,212 | 8/1994 | Geffken et al. . |
| 5,351,163 | 9/1994 | Dawson et al. . |
| 5,357,132 | 10/1994 | Turner . |
| 5,359,217 | 10/1994 | Murai . |
| 5,369,296 | 11/1994 | Kato . |
| 5,406,447 | 4/1995 | Miyazaki . |
| 5,416,042 | 5/1995 | Beach et al. . |
| 5,447,882 | 9/1995 | Kim . |
| 5,461,536 | 10/1995 | Beach et al. . |
| 5,478,772 | 12/1995 | Fazan . |
| 5,479,316 | 12/1995 | Smrtic et al. . |
| 5,563,762 | 10/1996 | Leung et al. . |
| 5,574,621 | 11/1996 | Sakamoto et al. . |
| 5,622,893 | 4/1997 | Summerfelt et al. . |
| 5,654,567 | 8/1997 | Numata et al. ........................ 257/306 |
| 5,708,559 | 1/1998 | Brabazon et al. ..................... 257/301 |
| 5,736,448 | 4/1998 | Saia et al. . |
| 5,827,766 | 10/1998 | Lou ....................................... 438/253 |
| 5,904,521 | 5/1999 | Jeng et al. ............................. 438/253 |

OTHER PUBLICATIONS

"High Dielectric Constant On–Chip Decoupling Capacitor Incorporated into BEOL Fabrication Process", IBM Technical Disclosure Bulletin, vol. 37, No. 10, Oct. 1994, pp. 413–414.

"High Capacitance Tungsten to Metal 1 Capacitor for High Frequency Applications", IBM Technical Disclosure Bullentin, vol. 38, No. 02, Feb. 1995, pp. 611–612.

*Primary Examiner*—David Hardy
*Attorney, Agent, or Firm*—McGinn & Gibb, P.C.; Richard M. Kotulak, Esq.

[57] ABSTRACT

The present invention provides a method for fabricating a capacitor within a semiconductor device comprising the steps of forming openings in an oxide dielectric to reach a lower conductor layer which will serve as a lower conductor plate of the capacitor; depositing capacitor electrode material, such as tungsten to fill the openings to form a capacitor electrode and planarizing the filled openings using chemical/mechanical polish; depositing a selected oxide capacitor dielectric over the capacitor electrodes and patterning the capacitor dielectric with photoresist to leave dielectric covering the area of the capacitor electrodes; stripping away the photoresist; adding an upper conductor layer on top of the capacitor dielectric to serve as the top plate of the capacitor. The above steps may be repeated to form multiple layers of capacitors within the semiconductor device.

20 Claims, 3 Drawing Sheets

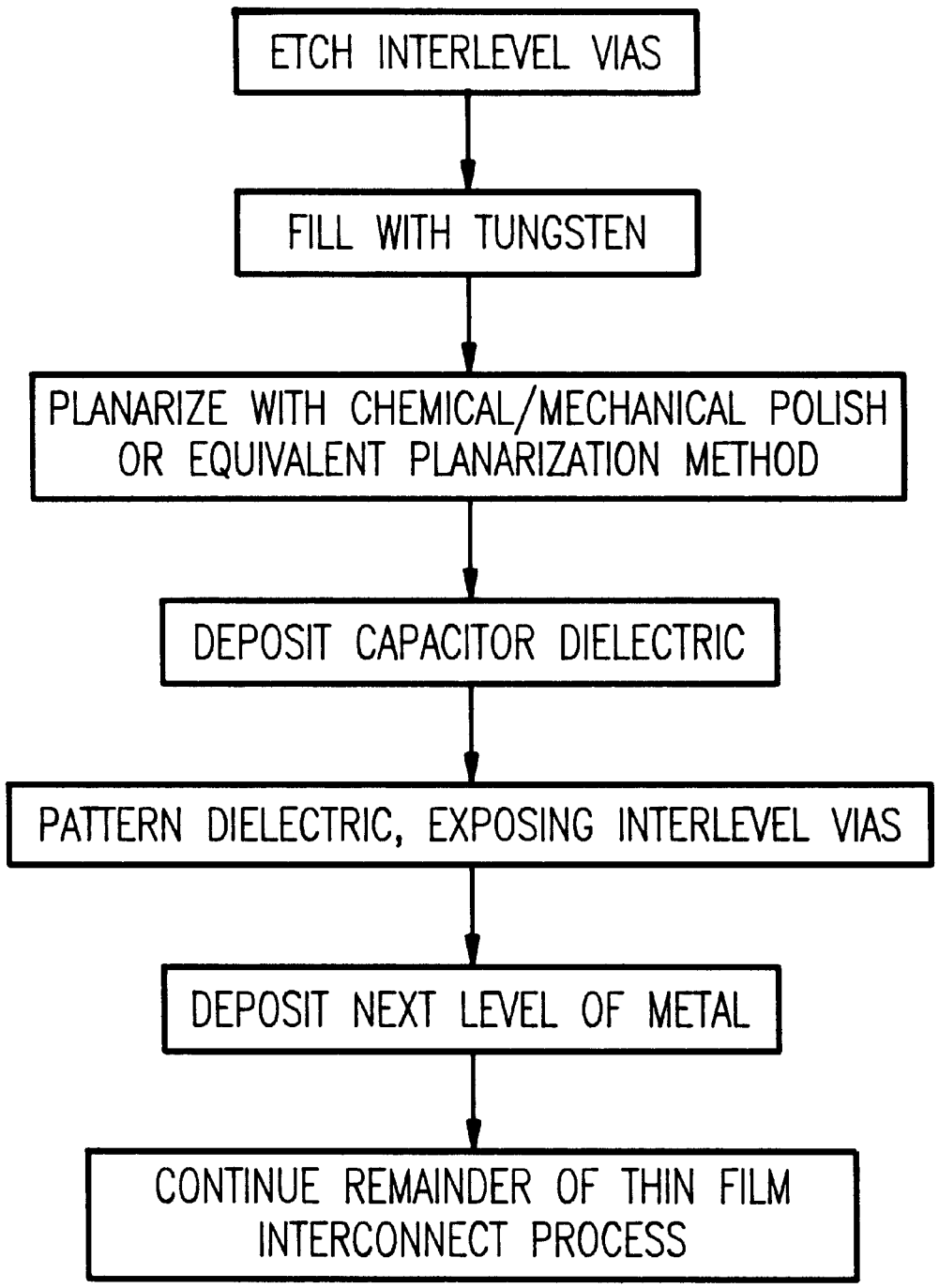

METAL-TO-METAL CAPACITOR HAVING THIN INSULATOR

FIELD OF THE INVENTION

The present invention relates to semiconductor devices, electronic packages, or other structures with more than one vertically stacked plane of thin-film conductor wiring. More particularly, the invention relates to a capacitor used in such a device, and the method for producing the capacitor.

BACKGROUND OF THE INVENTION

Generally, semiconductor devices contain multiple levels of conductor wiring. As lithographic dimensions have reduced, and the degree of device integration has increased, these structures have become increasingly planar. This trend is projected to continue into the sub 0.25 micron regime by most major semiconductor fabricators.

One disadvantage of this industry trend is that the relatively thick dielectric layers necessary to reduce parasitic wiring capacitance make the incorporation of intentional conductor to conductor capacitors very area intensive. This is compounded by relatively poor capacitance tracking due to thickness variation in the planarized dielectrics. Capacitive elements are critical to many circuit applications. High capacitance per unit area is essential for cost effective design.

Previous versions of thin film capacitor devices were found unsatisfactory because of capacitor dielectric defects due to irregularities in an etched metal capacitor plate, dielectric defects at the edge of the capacitor plate, and leakage around the capacitor plate because of conductive residues.

SUMMARY OF THE INVENTION

It is an object of the present invention to provide a semiconductor capacitor device that operates reliably and effectively.

A further object of the invention is to provide a method for fabricating a capacitor within a semiconductor device that is easy to implement and does not increase the total processing time significantly.

The present invention provides a method for fabricating a capacitor within a semiconductor device comprising the steps of forming openings in an oxide dielectric to reach a lower conductor layer; depositing capacitor electrode material, such as tungsten to fill the openings to form a capacitor electrode and planarizing the filled openings using chemical/mechanical polish; depositing a selected oxide capacitor dielectric over the capacitor electrodes and patterning the capacitor dielectric with photoresist to leave dielectric covering the area of the capacitor electrodes; stripping away the photoresist; and adding an upper conductor layer on top of the capacitor dielectric to serve as the top plate of the capacitor. The above steps may be repeated to form multiple layers of capacitors within the semiconductor device.

The foregoing method is easy to implement and can be done at low cost. The capacitor that results from the above method is reliable and effective. The known problems of metal-to-metal cap process defects are avoided. Moreover, capacitance tracking across the chip is improved.

BRIEF DESCRIPTION OF THE DRAWINGS

FIG. 5 is a flowchart summarizing the method of the present invention.

DETAILED DESCRIPTION OF A PREFERRED EMBODIMENT OF THE INVENTION

Figure 1:
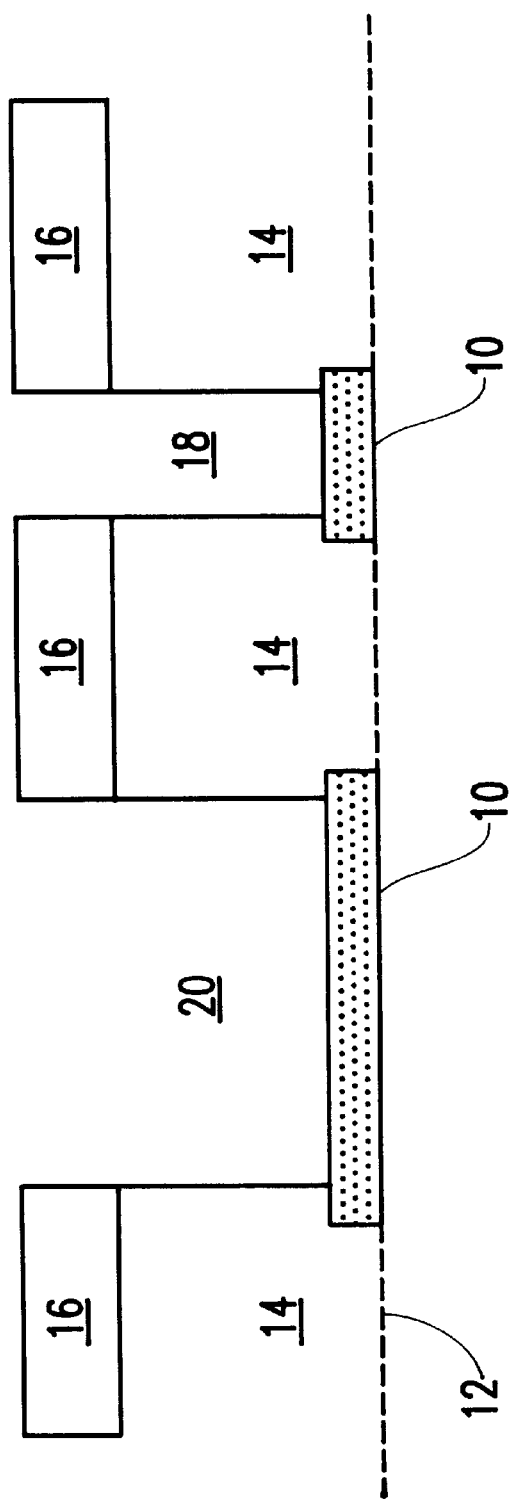
FIG. 1 is a depiction of a step in the method of the present invention.

The invention is best understood by reference to the accompanying drawings. FIG. 1 depicts the first step in the method of the present invention. FIG. 1 contemplates that complimentary metal oxide semiconductor ("CMOS") processing, which is well known in the art (or other semiconductor or thin film wiring process), has progressed such that a conductor. layer 10 forms a lower level 12. On top of the lower level 12 is an oxide dielectric 14. On top of the oxide dielectric 14 is a layer of photoresist 16. As shown in FIG. 1, one or more oxide openings 18 and 20 are created in the oxide dielectric 14 by "cutting through" the oxide dielectric 14 through a patterned photoresist layer 16 to expose, at the bottom of the oxide openings 18 and 20, the conductor layer 10. In the preferred embodiment of the invention, the conductor layer 10 is aluminum. Other suitable conductor materials are copper, tungsten, gold, single crystal, or polysilicon, and silicon alloys such as titanium silizide. In the preferred embodiment of the invention, the oxide openings 18 and 20 are created using reactive ion etch.

Figure 2:
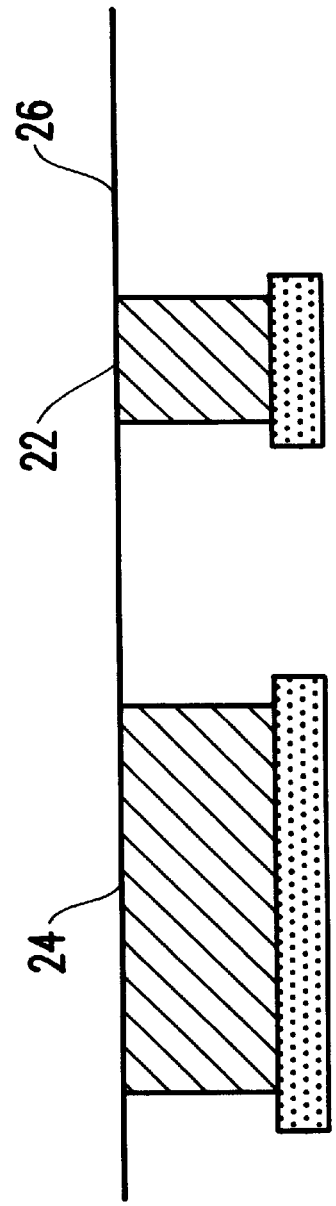
FIG. 2 is a depiction of another step in the method of the present invention.

Referring now to FIG. 2, the oxide openings 18 and 20 can be formed for use either as an inter-level via 22 or as a capacitor electrode 24. Since the formation of via openings, such as inter-level via 22 already is provided in most processing lines, little or no re-tooling will be required to implement the present invention. In FIG. 2, oxide openings 18 and 20 are filled with tungsten. Tungsten is used in the preferred embodiment of the invention for the capacitor electrode 24. Other materials suitable as capacitor electrode material are aluminum, copper, or other readily planarized conductor materials. The upper surface 26 then is planarized by chemical/mechanical polishing. The polishing provides a smooth capacitor electrode 24, and minimizes discontinuities between the tungsten and the dielectric interface.

Figure 3:
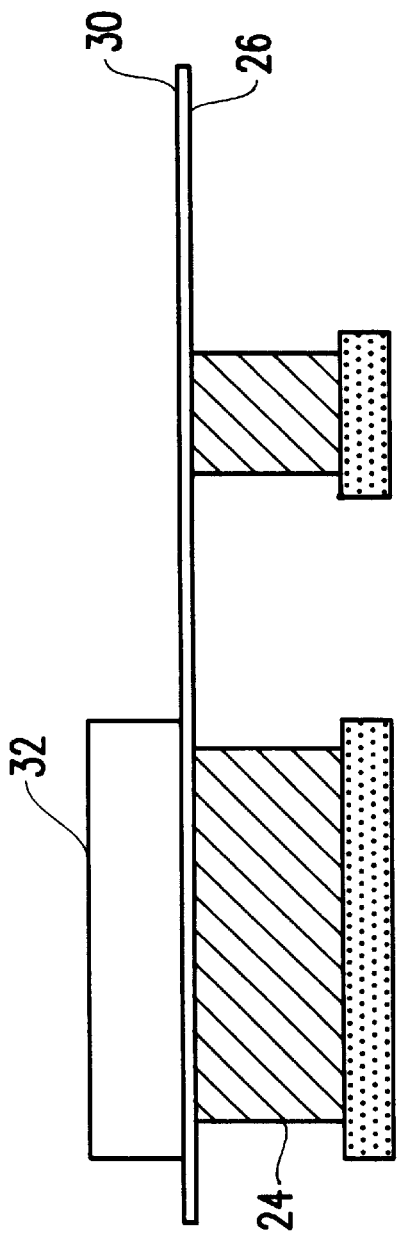
FIG. 3 is a depiction of another step in the method of the present invention.

FIG. 3 shows the next step in the method. As shown in FIG. 3, an oxide capacitor dielectric 30 is deposited on upper surface 26. In the preferred embodiment of the invention, the oxide capacitor dielectric 30 is silicon dioxide. The capacitor dielectric 30 can be formed from any single or composite dielectric of any thickness. In the preferred embodiment of the invention, the thickness of the layer of capacitor dielectric is 300 to 1800 Angstroms. Examples of other suitable capacitor dielectric 30 material include, but are not limited to silicon nitride and silicon oxy-nitride. The polishing of the upper surface 26 promotes a strong and even bond between the capacitor dielectric 30 and the capacitor electrode 24. Photoresist 32 then is layered on top of the capacitor dielectric 30. The photoresist 32 is patterned such that capacitor dielectric 30 completely covers the capacitor electrode 24. The photoresist 32 then is stripped away.

Figure 4:
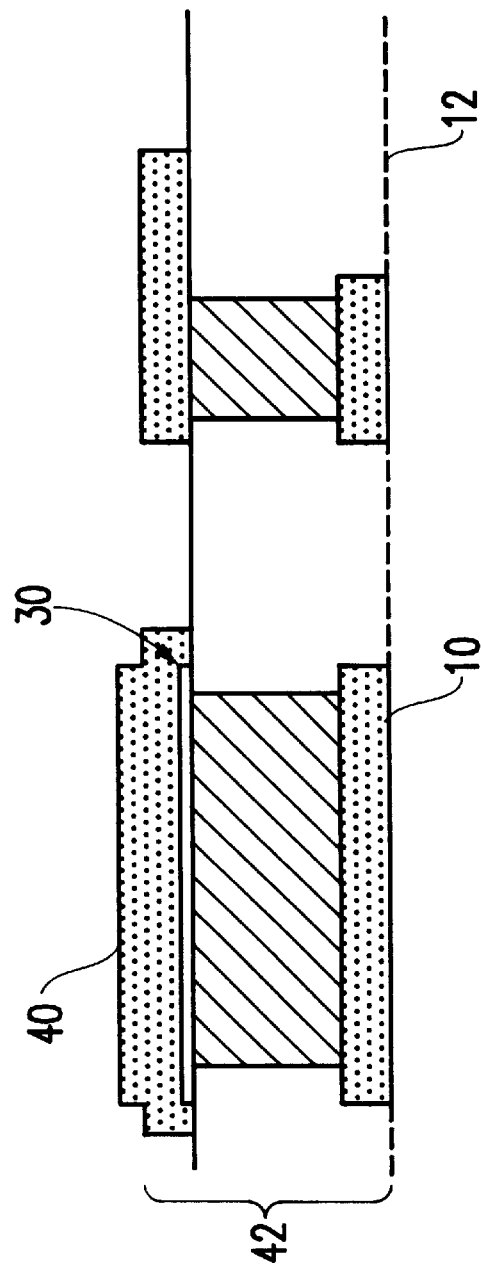
FIG. 4 is a depiction of another step in the method of the present invention.

As shown in FIG. 4, a second conductor layer 40 is formed by depositing a conducting material on top of the patterned layer of capacitor dielectric 30. Conductor layer 40 may form a lower plate of a second capacitor electrode. Conductor layer 40 also serves as the top plate of the capacitor 42 formed with conductive layer 10 as the lower level 12.

FIG. 5 is a flowchart of the method of the present invention.

The method of the present invention can be implemented at low cost. Known metal-to-metal cap process defects are avoided. Capacitor tracking across the chip is improved. Moreover, the yield is improved. For example, over 600 sites, a 1 volt yield of 100%, and a 40 volt yield of 99.6% was achieved for a 1,000 angstrom silicon dioxide dielectric.

The invention has been described with particularity. Those skilled in the art will know that modifications are possible that do not depart from the spirit or scope of the invention. Thus, the invention is limited only by the following claims and their equivalents.

What is claimed is:

1. A capacitor structure comprising:
    a first patterned conductive layer;
    an insulating layer over said first patterned conductive layer;
    a second patterned conductive layer over said insulating layer, wherein said insulating layer is positioned directly between said first patterned conductive layer and said second patterned conductive layer and said insulating layer includes at least one via between said first patterned conductive layer and said second patterned conductive layer;
    a capacitor conductor substantially filing a first via of said at least one via, wherein said capacitor conductor includes a polished surface; and
    a capacitor insulator positioned directly between said polished surface of said capacitor conductor and said second patterned conductive layer.

2. The capacitor structure in claim 1, wherein said capacitor insulator has a first thickness and said first patterned conductive layer, said second patterned conductive layer and said capacitor conductor each have thicknesses greater than said first thickness.

3. The capacitor structure in claim 1, wherein said capacitor insulator has a thickness between 300 and 1800 Angstroms.

4. The capacitor structure in claim 1, wherein said capacitor insulator has a thickness of approximately 1000 Angstroms.

5. The capacitor structure in claim 1, wherein said capacitor insulator has a thickness of approximately 300 Angstroms.

6. The capacitor structure in claim 1, wherein:
    said first patterned conductive layer, said second patterned conductive layer and said capacitor conductor each comprise at least one of aluminum, copper, tungsten, gold, single crystal polysilicon, poly-crystal polysilicon and silicon alloys; and
    said insulating layer and said capacitor insulator each comprise at least one of silicon dioxide, silicon nitride and silicon oxy-nitride.

7. The capacitor structure in claim 1, wherein:
    said first patterned conductive layer comprises a lower capacitor plate;
    said second patterned conductive layer comprises a top capacitor plate; and
    said capacitor insulator is positioned between said capacitor conductor and said top capacitor plate.

8. The capacitor structure in claim 7, wherein said lower capacitor plate, said capacitor conductor, said capacitor insulator and said top capacitor plate comprise a capacitor formed in a portion of a complimentary metal oxide semiconductor device.

9. A complimentary metal oxide semiconductor device comprising:
    a first patterned conductive layer;
    an insulating layer over said first patterned conductive layer;
    a second patterned conductive layer over said insulating layer, wherein said insulating layer is positioned directly between said first patterned conductive layer and said second patterned conductive layer and said insulating layer includes at least one via between said first patterned conductive layer and said second patterned conductive layer;
    a capacitor conductor substantially filling a first via of said at least one via, wherein said capacitor conductor includes a polished surface; and
    a capacitor insulator positioned directly between said polished surface of said capacitor conductor and said second patterned conductive layer.

10. The complimentary metal oxide semiconductor device in claim 9, wherein said capacitor insulator has a first thickness and said first patterned conductive layer, said second patterned conductive layer and said capacitor conductor each have thicknesses greater than said first thickness.

11. The complimentary metal oxide semiconductor device in claim 9, wherein said capacitor insulator has a thickness between 300 and 1800 Angstroms.

12. The complimentary metal oxide semiconductor device in claim 9, wherein said capacitor insulator has a thickness of approximately 1000 Angstroms.

13. The complimentary metal oxide semiconductor device in claim 9, wherein said capacitor insulator has a thickness of approximately 300 Angstroms.

14. The complimentary metal oxide semiconductor device in claim 9, wherein:
    said first patterned conductive layer, said second patterned conductive layer and said capacitor conductor each comprise at least one of aluminum, copper, tungsten, gold, single crystal polysilicon, poly-crystal polysilicon and silicon alloys; and
    said insulating layer and said capacitor insulator each comprise at least one of silicon dioxide, silicon nitride and silicon oxy-nitride.

15. The complimentary metal oxide semiconductor device in claim 9, wherein:
    said first patterned conductive layer comprises a lower capacitor plate;
    said second patterned conductive layer comprises a top capacitor plate; and
    said capacitor insulator is positioned between said capacitor conductor and said top capacitor plate.

16. A capacitor formed in a structure having a first conductive layer, a second conductive layer and an insulating layer positioned directly between said first conductive layer and said second conductive layer, said insulating layer including at least one opening between said first conductive layer and said second conductive layer, said capacitor comprising:
    a conductor substantially filling a first opening of said at least one opening, wherein said conductor includes a polished surface; and
    an insulator positioned directly between said polished surface of said conductor and said second conductive layer.

17. The capacitor in claim 16, wherein said insulator has a first thickness and said first conductive layer, said second conductive layer and said conductor each have thicknesses greater than said first thickness.

18. The capacitor in claim 16, wherein said insulator has a thickness between 300 and 1800 Angstroms.

19. The capacitor in claim 16, wherein said insulator has a thickness of approximately 300 Angstroms.

20. The capacitor in claim 16, wherein:

said first conductive layer, said second conductive layer and said conductor each comprise at least one of aluminum, copper, tungsten, gold, single crystal polysilicon, poly-crystal polysilicon and silicon alloys; and said insulating layer and said insulator each comprise at least one of silicon dioxide, silicon nitride and silicon oxy-nitride.

* * * * *